US010957695B2

(12) United States Patent
Chen et al.

(10) Patent No.: US 10,957,695 B2
(45) Date of Patent: Mar. 23, 2021

(54) ASYMMETRIC GATE PITCH

(71) Applicant: Taiwan Semiconductor Manufacturing Co., Ltd., Hsinchu (TW)

(72) Inventors: Wei-Barn Chen, Tainan (TW); Chi-Cherng Jeng, Tainan (TW); Shiu-Ko Jangjian, Tainan (TW); Ting-Huang Kuo, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/657,528

(22) Filed: Oct. 18, 2019

(65) Prior Publication Data

US 2020/0051978 A1 Feb. 13, 2020

Related U.S. Application Data

(62) Division of application No. 15/885,596, filed on Jan. 31, 2018, now Pat. No. 10,475,790.

(60) Provisional application No. 62/564,636, filed on Sep. 28, 2017.

(51) Int. Cl.
*H01L 27/088* (2006.01)
*H01L 21/8234* (2006.01)
*H01L 29/06* (2006.01)

(52) U.S. Cl.
CPC .. *H01L 27/0886* (2013.01); *H01L 21/823431* (2013.01); *H01L 21/823456* (2013.01); *H01L 29/0649* (2013.01)

(58) Field of Classification Search
None
See application file for complete search history.

(56) References Cited

U.S. PATENT DOCUMENTS

| 2008/0203439 | A1 | 8/2008 | Nonaka |
| 2012/0129304 | A1 | 5/2012 | Nowak |
| 2013/0193526 | A1* | 8/2013 | Lo .................. H01L 29/423 257/401 |
| 2015/0318281 | A1* | 11/2015 | Cheng .............. H01L 29/456 257/384 |

(Continued)

*Primary Examiner* — Long Pham
(74) *Attorney, Agent, or Firm* — Sterne, Kessler, Goldstein & Fox P.L.L.C.

(57) ABSTRACT

The present disclosure describes an exemplary asymmetric CPP layout for a semiconductor structure with a different gate pitch over the source and the drain regions to mitigate gate-to-gate parasitic capacitances over the drain region, thus improving cutoff frequency. For example, the semiconductor structure can include a fin on a substrate. The semiconductor structure can also include first and second gate structures formed on the fin and separated by a first space. The semiconductor structure can also include a third gate structure formed on the fin between the first and the second gate structures. The third gate structure can be separated from the first gate structure by a second pitch and separated from the second gate structure by a third pitch that is greater than the second pitch. The semiconductor structure further includes a source region formed between the first and third gate structures, and a drain region formed between the third and the second gate structures.

20 Claims, 7 Drawing Sheets

(56) References Cited

U.S. PATENT DOCUMENTS

| | | | |
|---|---|---|---|
| 2016/0085904 A1* | 3/2016 | Song | G06F 30/398 257/48 |
| 2017/0286584 A1* | 10/2017 | Lefferts | G06F 30/398 |
| 2017/0323832 A1* | 11/2017 | Yang | H01L 29/66545 |
| 2017/0345930 A1* | 11/2017 | Liao | H01L 29/66659 |
| 2018/0158935 A1* | 6/2018 | Wang | H01L 29/0834 |
| 2018/0315831 A1* | 11/2018 | Li | H01L 21/82348 |
| 2020/0051978 A1* | 2/2020 | Chen | H01L 27/0886 |

* cited by examiner

ASYMMETRIC GATE PITCH

CROSS-REFERENCE TO RELATED APPLICATION

This application is a divisional of U.S. Non-Provisional patent application Ser. No. 15/885,596 filed on Jan. 31, 2018 and titled "Asymmetric Gate Pitch," which claims the benefit of U.S. Provisional Patent Application No. 62/564,636, filed on Sep. 28, 2017 and titled "Asymmetric Gate Pitch." The entire contents of both applications are incorporated by reference herein in their entireties.

BACKGROUND

Fin field effect transistors (finFETs) demonstrate several advantages over planar FETs in terms of, for example, (i) reduced power consumption, (ii) improved threshold voltage control, (iii) channel control, and (iv) leakage current characteristics. However, due to the surface area between the fin and the gate, parasitic capacitances (e.g., between the source/drain (S/D) contacts and the gate structure) may be larger for finFETs as compared to planar FETs. Parasitic capacitances can adversely impact the finFET's cutoff frequency ($f_T$), which sets a boundary for the finFET's frequency response.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

DETAILED DESCRIPTION

Figure 1:
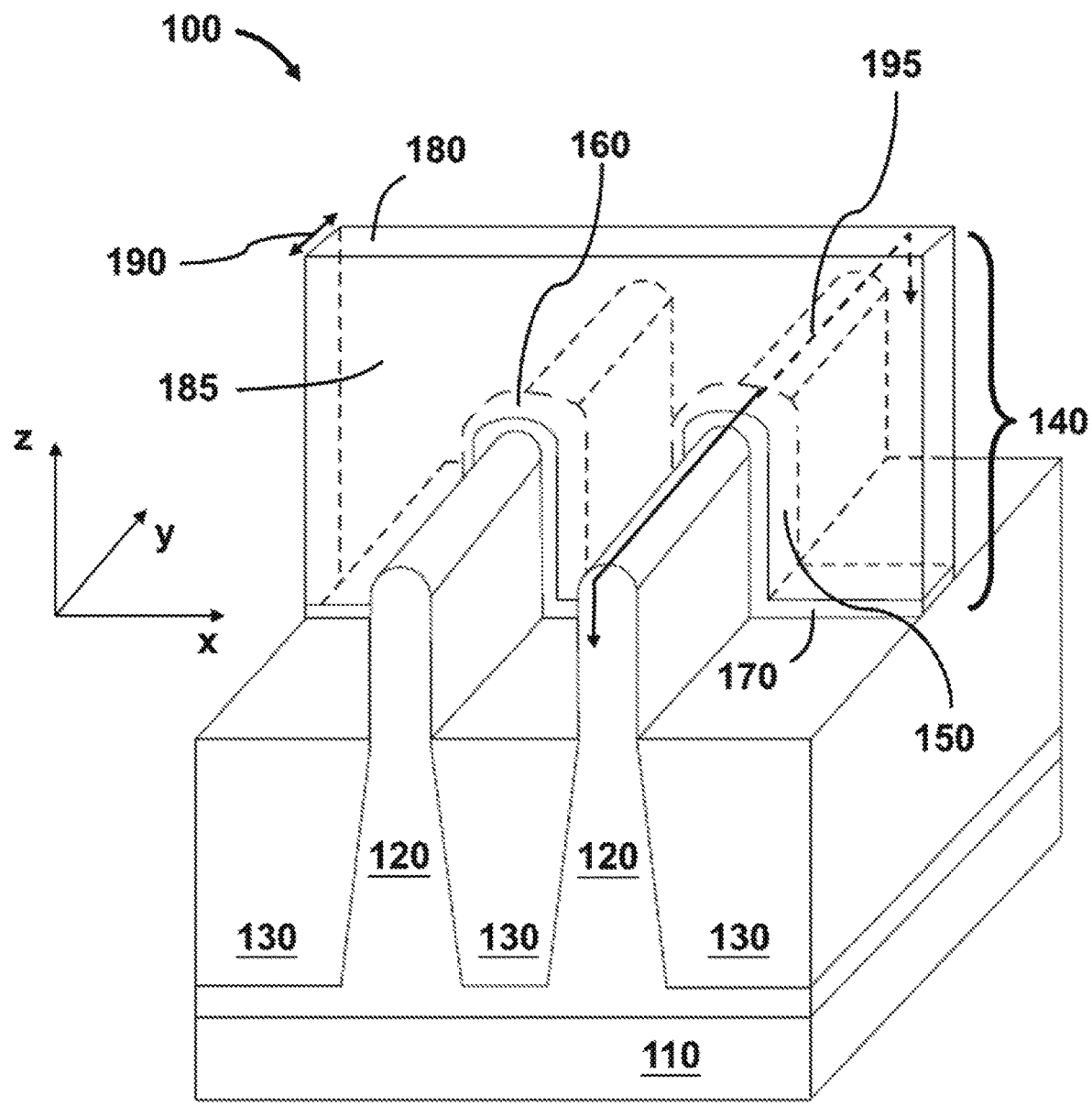
FIG. 1 is an isometric view of a semiconductor device structure according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. A type of FET is referred to as "a metal oxide semiconductor field effect transistor (MOSFET)." MOSFETs can be a planar structure built in and on the planar surface of a substrate such as a semiconductor wafer. Advances in semiconductor manufacturing have resulted in the use of three-dimensional, vertically-oriented structures of semiconductor material called "fins" to form fin field effect transistors (finFETs). The term "finFET" refers to a. FET formed over a semiconductor (e.g., silicon) fin that is vertically oriented with respect to the planar surface of a wafer.

FinFETs demonstrate several advantages over planar FETs in terms of, for example, reduced power consumption, improved threshold voltage control, channel control, and leakage current characteristics. However, due to the surface area between the fin and the gate, parasitic capacitances (e.g., between the source/drain (S/D) contacts and the gate structure) may be larger for finFETs as compared to planar FETs. Parasitic capacitances can adversely impact the finFET's cutoff frequency ($f_T$), which sets a boundary for the finFETs frequency response. The cutoff frequency ($f_T$) of a field effect transistor (FET) can be described according to the following equation:

$$f_T = \frac{g_m}{2\pi C_{gg}},$$

where $g_m$ is the transistor's gain and $C_{gg}$ is the gate-to-gate parasitic capacitance. The gate-to-gate parasitic capacitance can be affected by the gate-to-gate pitch, e.g., the distance between neighboring gates. A smaller gate-to-gate parasitic capacitance is desirable to widen the transistor's cutoff frequency and thus improve the transistor's frequency response.

The present disclosure is directed to multiple gate devices with an asymmetric critical poly pitch (CPP) layout that reduces the gate-to-gate pitch over the source region and increases the gate-to-gate pitch over the drain region in order to reduce the gate-to-gate parasitic capacitance ($C_{gg}$), and consequently improve the transistor's cutoff frequency ($f_T$). For example, in the case of a three gate structure, the pitch between a pair of adjacent gates can be larger over the shared drain region and smaller over the shared source region.

For example purposes, the asymmetric CPP will be described in the context of finFETs. Based on the disclosure herein, asymmetric CPP may not be limited to finFETs and can be applied to other types of transistors such as, for example, planar transistors and any other types of transistors where the transistor cutoff frequency ($f_T$) may be affected by the gate pitch. Also, asymmetric CPP may be applicable to both n-type FETs (NFETs) and p-type FETs (PFETs). These other types of transistors are within the spirit and scope of this disclosure.

FIG. 1 is an isometric view of a finFET structure 100 that can include one or more finFETs. By way of example and not limitation, finFET structure 100 can include substrate 110 with a plurality of fins 120 formed thereon, and a plurality of isolation structures 130 disposed between fins 120. One or more gate structures 140 can be formed over each fin's sidewall surface 150 and top surface 160 along the x-direction. In some embodiments, more than one gate structure, parallel to gate structure 140, may exist (e.g., along the y-direction). The gate structures can be separated from each other by a distance or a space. This gate structure spacing is referred to as the "gate-to-gate pitch." In some embodiments, gate structure 140 can include a gate dielectric 170 and a gate electrode 180. For illustration purposes, FIG. 1 includes select portions of a finFET structure and other portions (not shown) may be included. For example, gate dielectric 170 and gate electrode 180 can include additional individual layers. These additional individual layers may be included. FIG. 1 may also include other layers—such as for example—gate spacers, metal contacts, source/drain (S/D) regions, and a gate hard mask layer on top of gate electrode 180.

As discussed above, gate structures, similar to gate structure 140, can form "gate lines" that are separated according to a gate-to-gate pitch. Gate structure 140 can have a gate width 190 (e.g., along the y-direction) that can range from about 3 nm to about 30 nm. Further, each gate structure 140 includes two sidewall surfaces 185. In some embodiments, the gate-to-gate pitch between two gate structures can be defined as the distance measured between a sidewall surface of the first gate structure and a sidewall surface of the second gate structure, where both sidewall surfaces used in the measurement reside on the same side of the respective gate structures. The gate-to-gate pitch is determined by design rules and can be different for each device layout, according to some embodiments. The gate-to-gate pitch can also be defined in manufacturing through photolithographic operations.

In some embodiments, substrate 110 can be a bulk semiconductor wafer or a semiconductor on insulator (SOI) wafer. Further, substrate 110 can be made of silicon (Si) or another elementary semiconductor such as, for example, (i) germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) combinations thereof.

In some embodiments, fins 120 can be perpendicular to substrate's surface (e.g., along the z-direction) and can be made of the same, or different, material as substrate 110. For example, fins 120 can be made of silicon or another elementary semiconductor such as, for example, (i) Ge; (ii) a compound semiconductor including silicon carbide, GaAs, GaP, InP, InAs, and/or InSb; (iii) an alloy semiconductor including SiGe, GaAsP, AlInAs, AlGaAs, GaInAs, GaInP, and/or GaInAsP; or (iv) combinations thereof.

Isolation structures 130 can made of a dielectric material such as silicon oxide, silicon nitride, silicon oxynitride, fluorine-doped silicate glass (FSG), a low-k dielectric material with a dielectric constant (k-value) lower than 3.9. By way of example and not limitation, isolation structures 130 can be shallow trench isolation (STI) structures. In some embodiments, the STI structures can be formed after the fin formation. By way of example and not limitation, the space between fins 120 is filled with a dielectric material and can be followed by a chemical mechanical polishing (CMP) and an etchback process to recess ("pull back") the STI structure and expose the fins. Isolation structures 130 may include a multi-layer structure. For example, isolation structures 130 can have one or more dielectric layers therein. Isolation structures 130 provide electrical isolation to fins 120.

As discussed above, gate structure 140 can include a gate dielectric 170, a gate electrode structure 180, and/or one or more additional layers (e.g., spacers, top capping layer, etc.) which are not shown in FIG. 1 for simplicity. In some embodiments, gate dielectric 170 can be a stack of thin layers which may include an interfacial layer (IL) and a high-k dielectric. IL can be a native oxide (e.g., silicon oxide) with thickness that can range from about 20 Å to about 30 Å. IL can be grown through an oxidation process that occurs naturally when a semiconductor surface, such as Si, is exposed to atmosphere. High-k dielectric can be deposited by atomic layer deposition (ALD) and its thickness can range from about 10 Å to about 20 Å. By way of example and not limitation, the high-k dielectric can be hafnium oxide ($HfO_2$), a hafnium silicate-based material, or another suitable dielectric material with dielectric constant (k-value) greater than 3.9—which is the dielectric constant of $SiO_2$ and is used as a reference.

In some embodiments, gate electrode 180 may also include multiple layers such as a multiple gate (MPG) stack layer, work function metals (WFMs), and a metal fill layer that are not shown in FIG. 1 for simplicity. The number and type of metallic layers in the MPG stack may depend on the transistor's threshold voltage requirements. Exemplary metallic layers in the MPG stack may include a tantalum nitride (TaN) bottom layer and one or more titanium nitride (TiN) layers. In some embodiments, the TaN bottom layer is deposited with a chemical vapor deposition (CVD) process. By way of example and not limitation, the thickness of the TaN bottom layer can range from about 10 Å to about 15 Å. In some embodiments, the one or more TiN layers can be formed with an ALD or a diffusion process. The TiN layers can be deposited, for example, with an ALD process and can have a thickness between about 8 Å and about 12 Å, while the TiN layers can be deposited with a diffusion process and can be thicker, e.g., with a thickness ranging from about 12 Å to about 50 Å.

In some embodiments, the WFM stack can include titanium/aluminum (Ti/Al) bi-layers or a Ti—Al alloy, both of which can be deposited with an ALD process. By way of example and not limitation, the WFM stack can have a thickness range between about 20 Å to about 35 Å. The WFM stack can adjust the work function of the metal gate electrode and influence the threshold voltage of the transistor. The thickness and the number of the one or more TiN layers, in combination with the WFM stack, can set the transistor's threshold voltage.

By way of example and not limitation, p-type work function metals include titanium nitride (TiN), tantalum nitride (TaN), ruthenium (Ru), molybdenum (Mo), aluminum (Al), tungsten nitride (WN), zirconium silicide ($ZrSi_2$), molybdenum silicide ($MoSi_2$), tantalum silicide ($TaSi_2$), nickel silicide ($NiSi_2$), or other suitable p-type work function materials, or combinations thereof. Exemplary n-type work function metals that may be included in the metal gate structure include titanium (Ti), silver (Ag), tantalum-aluminum (TaAl), carbon doped tantalum-aluminum (TaAlC), titanium aluminum nitride (TiAlN), tantalum carbide (TaC), tantalum carbon nitride (TaCN), tantalum silicon nitride (TaSiN), manganese (Mn), zirconium (Zr), other suitable n-type work function materials, or combinations thereof. The work function layer(s) may be deposited with chemical vapor deposition (CVD), plasma-enhanced CVD (PECVD), physical vapor deposition (PVD), atomic layer deposition (ALD), plasma-enhanced ALD (PEALD), and/or other suitable deposition process. The fill metal layer may include Al, or W, and/or other suitable materials. The fill metal may be formed by CVD, PECVD, PVD, ALD, PEALD, plating, and/or other suitable processes. The fill metal may be deposited over the work function metal layer(s), thereby filling in the remaining portion of the trenches or openings formed by the removal of the sacrificial gate structure.

As discussed above, for simplicity, FIG. 1 does not include all the elements of structure 100. For example, FIG. 1 does not include the heavily doped or lightly doped S/D regions in fins 120, the S/D epitaxial layers on fins 120, the S/D contacts, the spacers of gate structure 140, and the interlayer dielectric layer (ILD) that surrounds gate structure 140.

Figure 2:
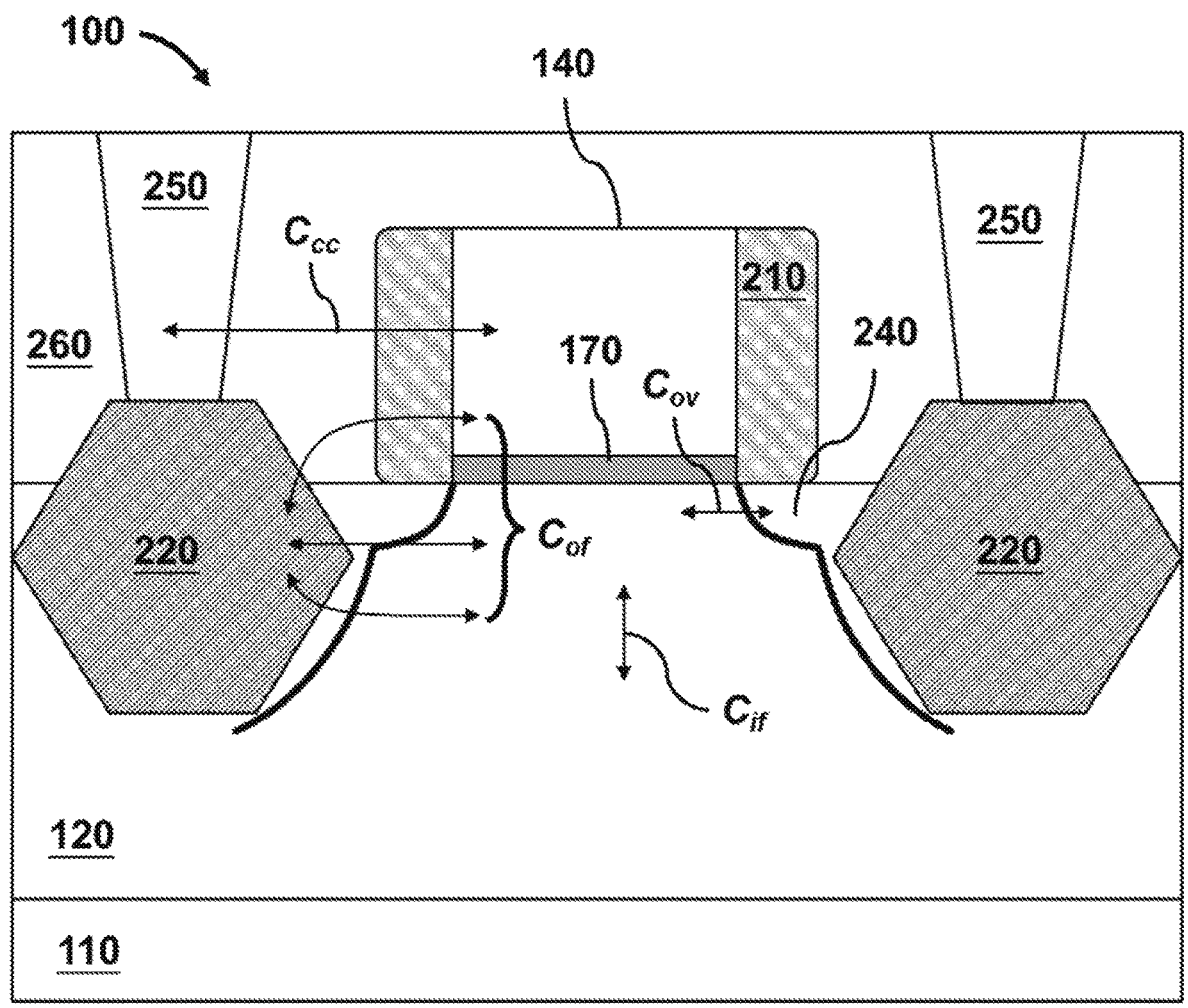
FIG. 2 is a cross sectional view of a fin field effect transistor (finFET), according to some embodiments.

FIG. 2 is a cross section of finFET structure 100 along plane 195 of FIG. 1. FIG. 2 includes additional elements such as, for example, gate spacers 210, heavily doped S/D epitaxial layers 220 (e.g., from about $10^{20}$ atoms/$cm^3$ to about $10^{21}$ atoms/$cm^3$), lightly doped S/D regions 240 (e.g., a doping gradient between about $10^{17}$ atoms/$cm^3$ to about $10^{20}$ atoms/$cm^3$), S/D contacts 250, and an ILD 260.

In some embodiments, heavily doped S/D epitaxial layers 220 can be either n-type doped or p-type doped. By way of example and not limitation, n-type dopants can be phosphorous (P), antimony (Sb), or arsenic (As); and a p-type dopant can be boron (B).

In some embodiments, S/D epitaxial layers 220 can include a Si-based multilayer material. In some embodiments, the Si-based material is formed by an epitaxial deposition/partial etch process, which repeats the epitaxial deposition/partial etch process at least once. Such repeated deposition/partial etch process is also referred to as a cyclic deposition-deposition-etch (CDDE) process. According to some embodiments, S/D epitaxial layers 220 can be, for example, B-doped SiGe epitaxial layers or P/carbon (C)-doped Si (Si:CP) epitaxial layers depending on the dopant type of the source/drain regions. Carbon is not an electron donor but it can impede the out-diffusion of phosphorus from Si-based material. By way of example and not limitation, B-doped SiGe epitaxial stacks can be used for p-type S/D regions and P/C-doped Si epitaxial stacks can be used for n-type S/D regions.

Referring to FIG. 2, several parasitic capacitance can be formed in exemplary FinFET structure 100 due to the close proximity of the aforementioned elements (e.g., S/D regions, S/D contacts, etc.) to gate structure 140. By way of example and not limitation, the following parasitic capacitances can be formed: (i) a contact capacitance ($C_{co}$) between S/D contacts 250 and gate structure 140; (ii) an outer fringe capacitance ($C_{of}$) between S/D epitaxial layers 220 and gate structure 140; (iii) an overlay capacitance ($C_{ov}$) between the lightly doped S/D regions 240 and gate structure 140; and (iv) an inner fringe capacitance ($C_{if}$) between fin 120 and gate structure 140.

In addition to the aforementioned parasitic capacitances, a gate-to-gate parasitic capacitance $C_{gg}$ can be formed if another gate structure is next to gate structure 140. Furthermore, in the case where gate structure 140 is disposed between two gate structures, two parasitic gate-to-gate capacitances $C_{gg}$ can be formed; e.g., between gate structure 140 and each of its neighboring gate structures.

Figure 3:
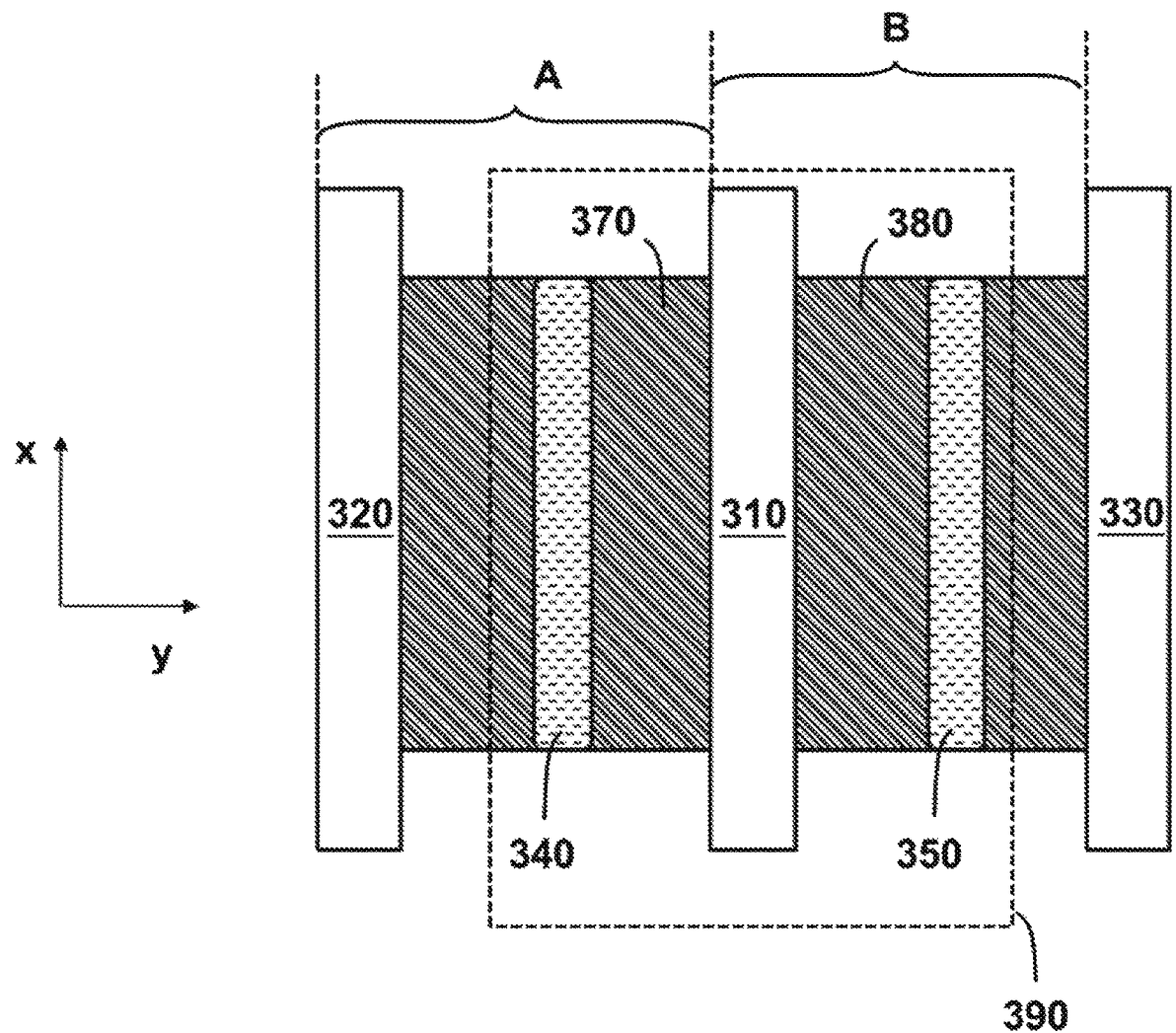
FIG. 3 is a top view of an example layout with three gate structures having a symmetric gate pitch, according to some embodiments.

FIG. 3 is a top view of a layout representation of a fin FET structure. The layout provides information about the relative position of various device elements (e.g., gate structures, contacts, active regions such as S/D regions, etc.) on a x-y plane. By way of example and not limitation, area 390 in FIG. 3 can represent a portion of the finFET structure that is similar to exemplary finFET structure 100 of FIG. 1, where gate structure 140 and source/drain contacts 250 in FIG. 1 can be depicted as rectangular structures, such as gate structure 310, source contact 340, and drain contact 350. In some embodiments, source and drain contacts (e.g., 340 and 350 of FIG. 3) can be about 40 nm wide. Though source and drain contacts 340 and 350 are represented in FIG. 3 as rectangular structures that are parallel to the direction of gate structure 310, this representation is not limiting. For example, source and drain contacts 340 and 350 may have other shapes, such as ovals, circular shapes, or squares.

FIG. 3 provides an example of gate-to-gate capacitances according to some embodiments, where gate structure 310 is between additional gate structures 320 and 330. In this example, gate structures 310, 320 and 330 are equally spaced from each other. In other words, gate pitch A (e.g., between gate structures 310 and 320) is equal to gate pitch B (e.g., between gate structures 310 and 330), or A=B. Source contact 340 and drain contact 350 are positioned at a half gate pitch distance (e.g., at A/2 and B/2) from gate structure 310.

In some embodiments, a source region 370 is formed in a portion of a fin, or a portion of a substrate, between gate structures 320 and 310. In some embodiments, a drain region 380 is formed in a portion of a fin, or a portion of a substrate, between gate structures 310 and 330. According to some embodiments, gate pitch A is over source region 370, and gate pitch B is over drain region 380.

The parasitic capacitance between gate structure 310 and drain contact 350 is inversely proportional to a distance B/2 that separates the two structures. In some embodiments, the parasitic capacitance between gate structure 310 and drain contact 350 can be reduced if gate pitch B over drain region 380 increases. However, gate pitch B cannot increase arbitrarily due to gate density requirements. To address this constraint, according to some embodiments, an asymmetric pitch over source region 370 and drain region 380 (e.g., A<B) can reduce the gate-to-gate parasitic capacitance $C_{gg}$ and the parasitic capacitance between gate structure 310 and drain contact 350.

Figure 4:
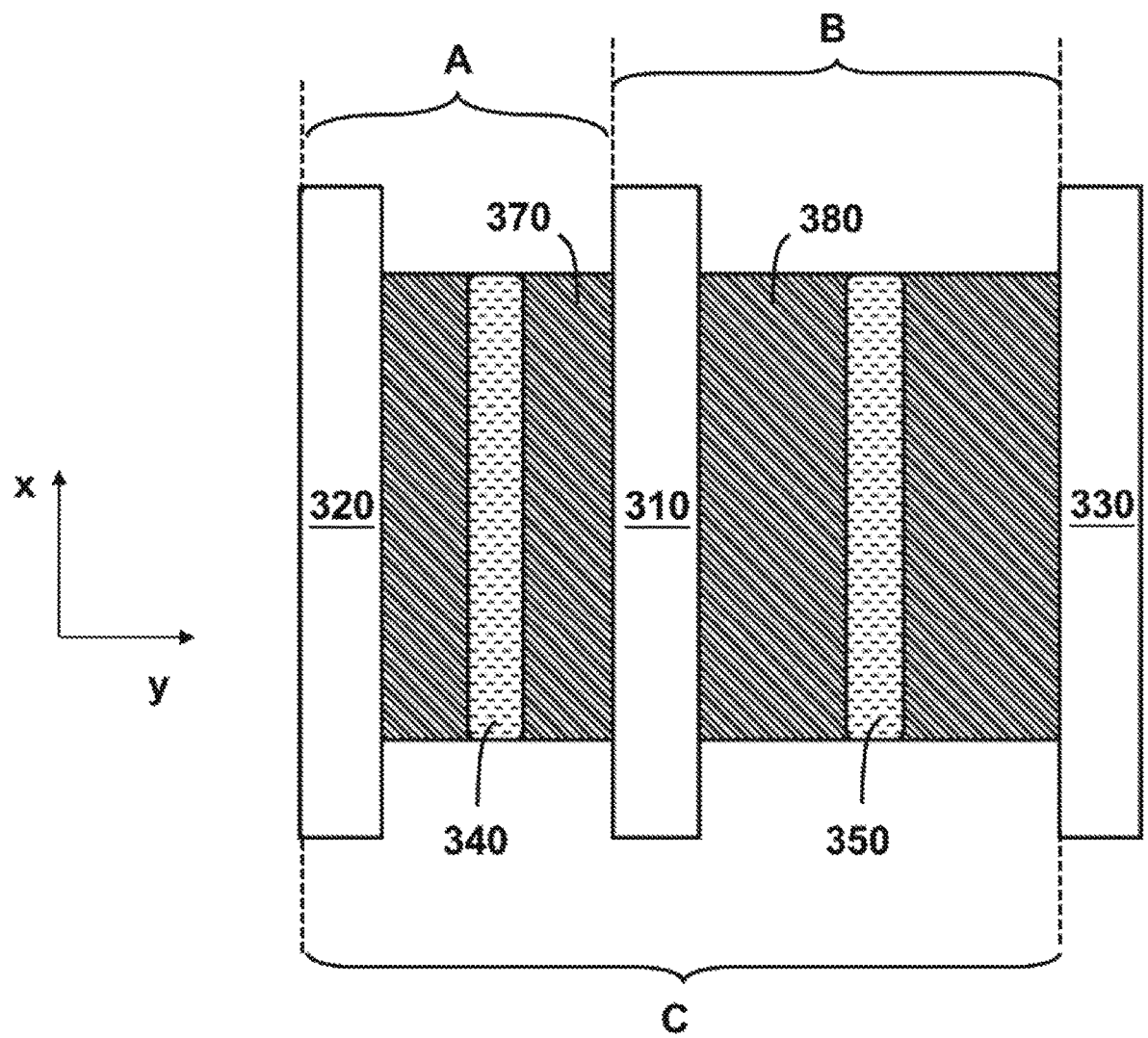
FIG. 4 is a top view of an example layout with three gate structures having an asymmetric gate pitch, according to some embodiments.

FIG. 4 is an exemplary layout, according to some embodiments, where gate pitch A over source region 370 and gate pitch B over drain region 380 are asymmetric, e.g., A<B. In some embodiments, gate pitch A over source region 370 and gate pitch B over drain region 380 can range from about 50 nm to about 150 nm. For example, gate pitch A can be 80 nm and gate pitch B can be 100 nm. In some embodiments gate pitch C can be defined as the distance between gate structure 320 and gate structure 330 or C=A+B. By way of example and not limitation, for an asymmetric gate pitch layout with C at 180 nm, where A is 80 nm and B is 100 nm, the cutoff frequency ($f_T$) may increase about 15% to about 20% (e.g., 18%) compared to a symmetric gate pitch layout with gate pitch C at 180 nm and A, B each at 90 nm. A contributing factor to the cutoff frequency improvement is a reduction of Miller's effect in the finFETs due to the increased distance between gate structures 310 and 330 (e.g., gate pitch B). The Miller's effect is proportional to gate-to-gate parasitic capacitance $C_{gg}$ formed over a shared drain region. Accordingly, as this gate-to-gate distance is increased, the gate-to-gate parasitic capacitance $C_{gg}$ formed over a shared drain region is decreased. In turn, the Miller's effect is decreased and cutoff frequency is improved.

In some embodiments, the asymmetric gate pitch (also referred to herein as "asymmetric CPP") may not be limited to a three-gate structure layout. By way of example and not limitation, it can be implemented in a layout that has more than three gate structures. Layouts that feature more than three gate structures are within the spirit and scope of this disclosure.

Figure 5:
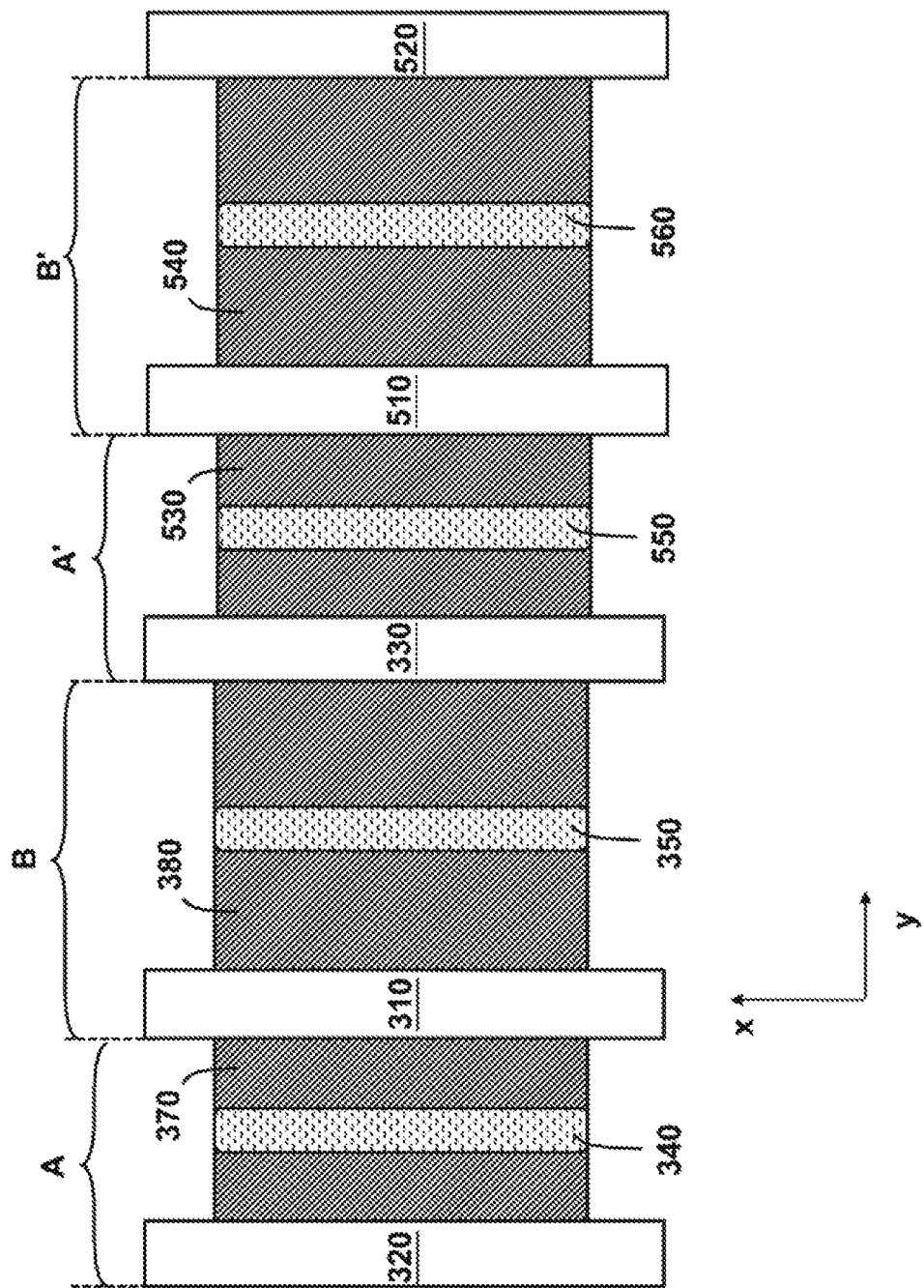
FIG. 5 is a top view of an example layout with five gate structures having an asymmetric gate pitch, according to some embodiments.

For example, in FIG. 5, an exemplary layout with five gate structures is shown. In the layout of FIG. 5, gate structures 510 and 520, source region 530, drain region 540, source contact 550, and drain contact 560 have been added to the layout of FIG. 4.

In some embodiments, source region 530 can be shared between gate structures 330 and 510. In some embodiments, drain region 540 can be shared between gate structures 510 and 520. By way of example and not limitation, gate pitch A', between gate structure 330 and gate structure 510, is over source region 530. Gate pitch B', between gate structure 510 and gate structure 520, is over drain region 540. In some embodiments, gate pitch B' is greater than gate pitch A'. Additionally, gate pitch A may be equal to gate pitch A', and gate pitch B may be equal to gate pitch B'. However, these exemplary spacings for gate pitches A, A', B, and B' are not limiting. For example, gate pitch A can have a different than gate pitch A' and gate pitch B can have a different than gate pitch B'.

Figure 6:
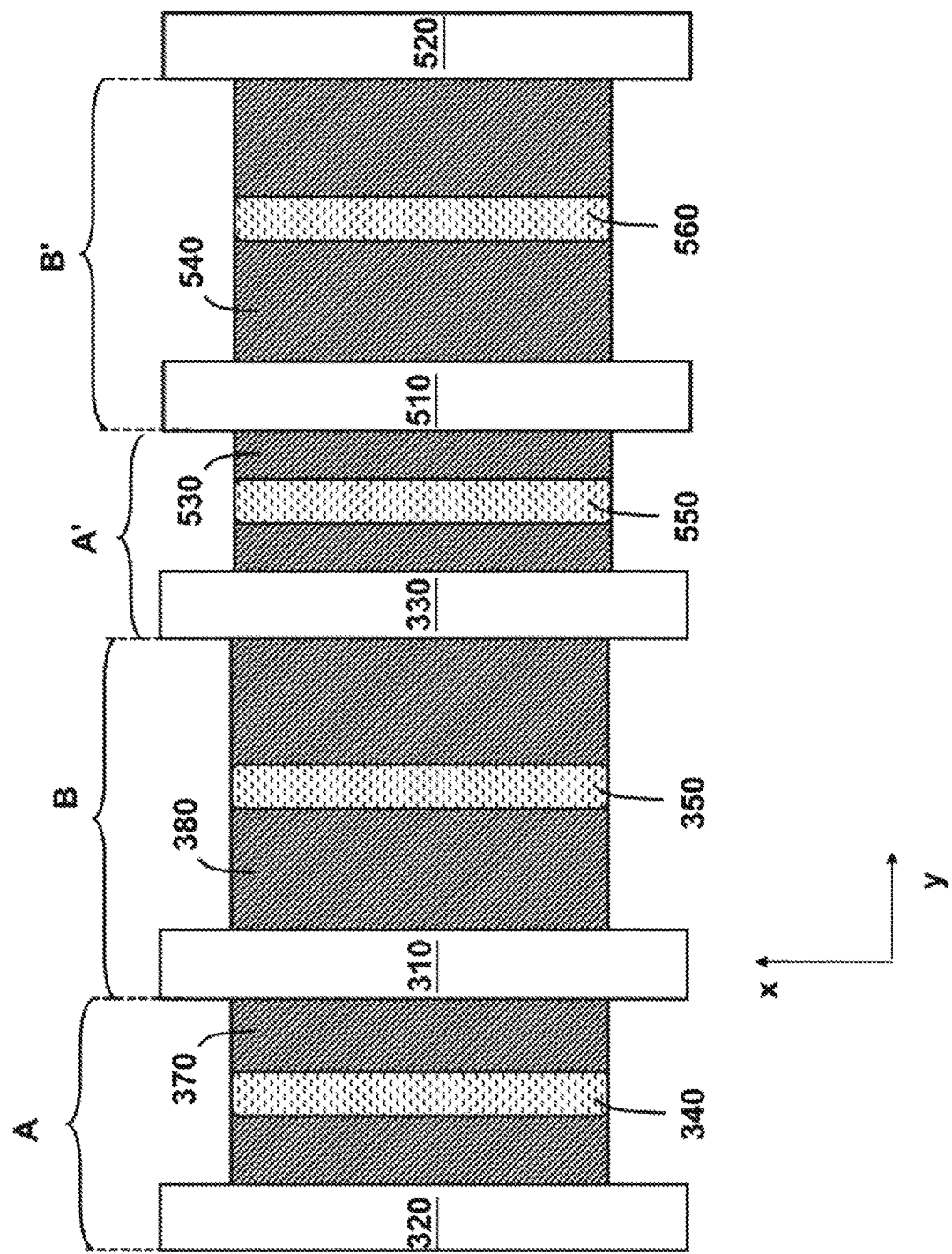
FIG. 6 is a top view of another example layout with five gate structures having an asymmetric gate pitch, according to some embodiments.

FIG. 6 is another exemplary layout with five gate structures (e.g., 320, 310, 330, 510, and 520) according to some embodiments. In FIG. 6, gate pitch A over source region 370 is smaller than gate pitch B over drain region 380, and gate pitch A' over source region 530 is smaller than gate pitch B' over drain region 540. In the exemplary layout of FIG. 6, gate pitch A can be greater or equal to gate pitch A' (e.g., A≥A') and gate pitch B can be greater or equal to gate pitch B' (e.g., B≥B'). However, these spacings for gate pitches A, A', B, and B' are not limiting. According to some embodiments, gate pitch A' can be greater than or equal to gate pitch A (e.g., A'≥A) and gate pitch B' can be greater than or equal to gate pitch B (B'≥B). Other possible spacings for gate pitches A, A', B, and B' may be possible as long as gate pitch A over source region 370 is smaller than gate pitch B over drain region 380 (e.g., A<B), and gate pitch A' over source region 530 is smaller than gate pitch B' (e.g., A'<B'). Hence, other possible combinations of gate pitches for A, A', B, and B' are within the spirit and scope of this disclosure.

Figure 7:
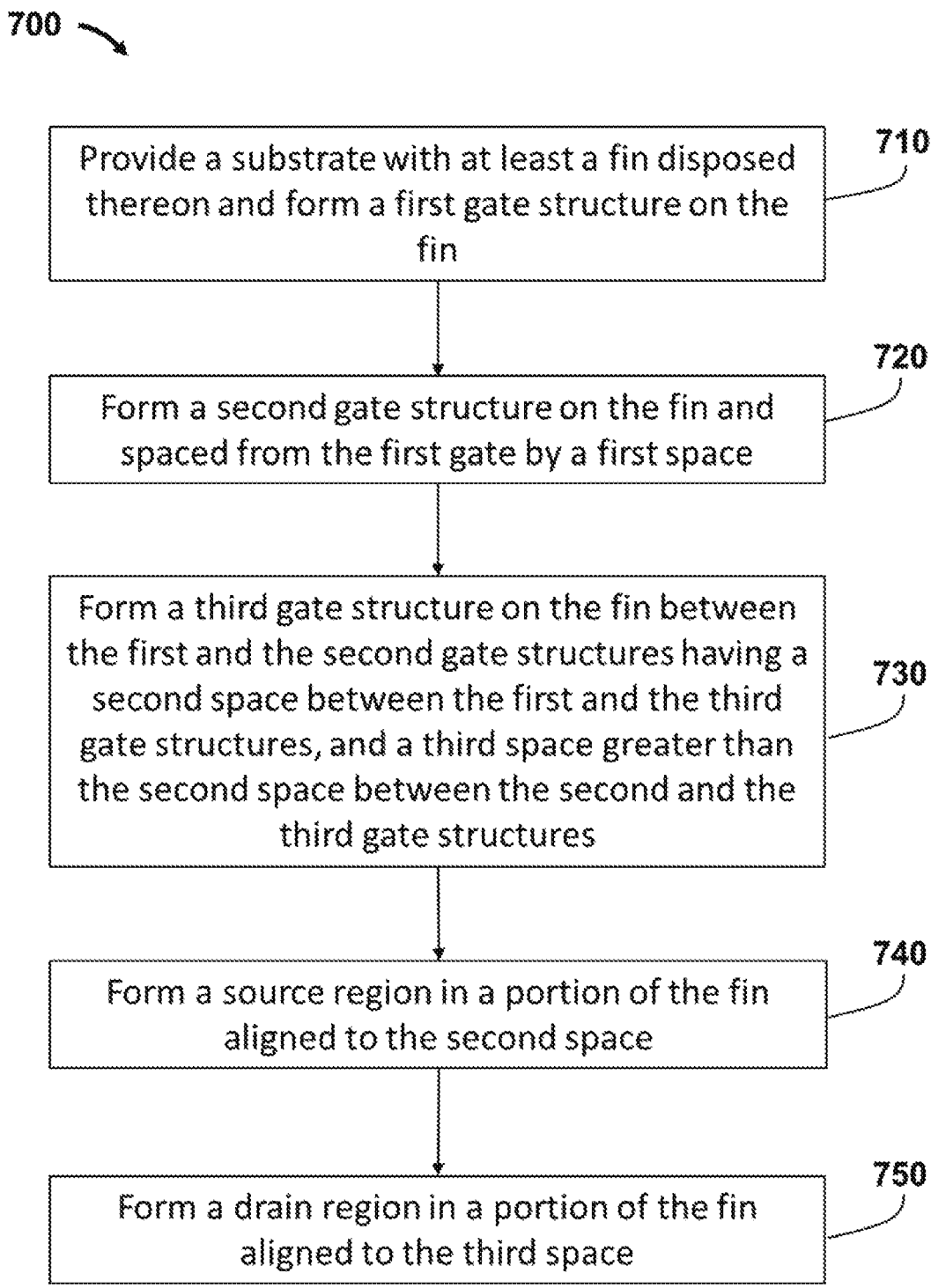
FIG. 7 is a flow chart diagram of a process for forming an asymmetric gate pitch layout, according to some embodiments.

FIG. 7 is a flow chart diagram of an exemplary process 700 that forms an asymmetric CPP layout for an exemplary three gate structure. The asymmetric CPP layout described by exemplary process 700 can improve a transistor's cutoff frequency ($f_T$) according to some embodiments. Other fabrication operations may be performed between the various operations of exemplary process 700 and are omitted for clarity. Exemplary process 700 may not be limited to the operation steps described below and may be extended to include more than three gate structures. For explanation purposes, the operations of process 700 are described in context of the example layout shown in FIG. 4. The operations of process 700 are not limited to this example layout and are applicable to other structures.

In operation 710, a first gate structure 320 is formed on at least one fin disposed on a substrate.

In operation 720, a second gate structure 330 is formed on the fin and can be separated from first gate structure 320 by a first space (or gate pitch) C.

In operation 730 a third gate structure 310 is formed on the fin between the first and the second gate structures (e.g., 320 and 330, respectively) with a second space (e.g. gate pitch A) separating the first and the third gate structures (e.g., 320 and 310, respectively), and a third space (e.g., gate pitch B) separating the second and third gate structures (e.g., 330 and 310, respectively). In some embodiments, the third space (e.g., gate pitch B) is greater than the second space (e.g., gate pitch A). According to some embodiments, the second and third spaces (e.g., gate pitch A and gate pitch B, respectively) can range from about 50 nm to about 150 nm. For example, the second space can be 80 nm and the third space can be 100 nm. In some embodiments, the first space (e.g., gate pitch C) can be defined as the distance between the first and second gate structures (e.g., gate structure 320 and gate structure 330, respectively) or the first space is equal to sum of the second space and the third space (e.g., C=A+B). According to some embodiments, for an asymmetric gate pitch layout with the first space (e.g., gate pitch C) at 180 nm, where the second space (e.g., gate pitch A) is 80 nm and the third space (e.g., gate pitch B) is 100 nm, the cutoff frequency ($f_T$) may increase about 15% to about 20% (e.g., 18%) compared to a symmetric gate pitch layout with the first space at 180 nm and each of the second and third spaces at 90 nm.

In operation 740, a source region 370 can be formed between the first and third gate structures (e.g., 320 and 310, respectively). In some embodiments, source region 370 is aligned to the second space (e.g., gate pitch A) and may include heavily and lightly doped regions formed on a top surface of a fin. Alternatively, source region 370 may include heavily and lightly doped regions formed on a top surface of a substrate if the FET geometry is planar. According to some embodiments, the second space (e.g., gate pitch) A is over source region 370. In some embodiments, source region 370 can be n-type or p-type and can be formed with an implant process.

In operation 750 a drain region 380 can be formed between the second and third gate structures (e.g., 330 and 310, respectively). In some embodiments, drain region 380 is aligned to the third space (e.g., gate pitch B) and may include heavily and lightly doped regions formed on a top surface of a fin. Alternatively, drain region 380 may include heavily and lightly doped regions formed on a top surface of a substrate if the FET geometry is planar. According to some embodiments, the third space (e.g., gate pitch B) can be over drain region 380. In some embodiments, drain region 380 can be n-type or p-type and can be formed with an implant process.

In some embodiments, source and drain contacts can be formed as shown in the layout of FIG. 4 between the gate structures. The source and drain contacts can be positioned at a half gate pitch distance, according to some embodiments. For example, source contact 340 can be positioned at a half gate pitch distance A/2 and drain contact 350 can be positioned at a half gate pitch distance B/2. The parasitic capacitance formed between gate structure 310 and drain contact 350 is inversely proportional to distance B/2 that separates the two structures. In some embodiments, the parasitic capacitance between gate structure 310 and drain contact 350 can be reduced if gate pitch B over drain region 380 is increased, as discussed above.

The embodiments described herein are directed to an asymmetric CPP layout with a different gate pitch over the source and the drain regions structures having three or more gate structures on a finFET, planar FET geometries, or other FET geometries where a transistor's cutoff frequency is dependent on gate pitch. According to some embodiments an asymmetric CPP can improve the cutoff frequency of a transistor due to mitigation of gate-to-gate and gate-to-drain contact parasitic capacitances. In some embodiments, the asymmetric CPP layout can be implemented in both p-type and n-type FETs. In addition, the asymmetric CPP layout is not limited to structure having three gate structures and is applicable to structures with additional gate structures. According to some embodiments, the asymmetric CPP layout can be implemented on gate structures independently of their respective dimensions. According to some embodiments, the asymmetric CPP layout can provide a 15% to about 20% (e.g., 18%) cutoff frequency ($f_T$) improvement.

In some embodiments, a structure includes a substrate with a fin disposed thereon. A first gate structure on the fin and a second gate structure on the fin that is spaced apart from the first gate by at least a first pitch. A third gate structure on the fin is disposed between the first and the second gate structures, where the third gate structure is spaced apart from the first gate structure by at least a second pitch larger than the first pitch. A source region is formed in a portion of the one or more fins between the first and second gate structures. A drain region is formed in a portion of the one or more fins between the second and the third gate structures.

In some embodiments, a structure includes a first and a second gate structures which are separated from each other by a first space and are disposed over a substrate with fins thereon. A third gate structure is disposed between the first and the second gate structures, where the third gate structure is separated from the first gate structure by a second space and from the second gate structure by a third space that is greater than the second space. A source region is formed in a portion of the fins and in the second space. Further, a drain region is formed in a portion of fins and in the third space.

In some embodiments, a method includes a substrate with at least a fin disposed thereon and a first gate structure is formed on the fin. A second gate structure is formed on the fin and separated from the first gate by a first space. A third gate structure is formed on the fin and disposed between the first and the second gate structures, where the third gate structure is separated from the first gate structure by a second pitch and from the second gate structure by a third pitch that is greater than the second pitch. A source region is formed in a portion of the fin and in the second space, and drain region is formed in a portion of the fin and in the third space.

The foregoing outlines features of embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a substrate with a fin disposed thereon;
   forming a first gate structure, a second gate structure, and a third gate structure on the fin, wherein the second gate structure is disposed between the first and third gate structures so that a spacing between the second and third gate structures is larger from a spacing between the first and second gate structures;
   forming a source region between the first and second gate structures; and
   forming a drain region between the second and third gate structures, wherein the drain region is larger than the source region.

2. The method of claim 1, further comprising:
   forming a source contact on the source region; and
   forming a drain contact on the drain region, wherein a distance between the drain contact and the second gate structure is greater than a distance between the source contact and the second gate structure.

3. The method of claim 2, wherein a distance between the drain contact and the third gate structure is larger than a distance between the source contact and the first gate structure.

4. The method of claim 2, wherein a distance between the drain contact and the third gate structure is larger than a distance between the source contact and the second gate structure.

5. The method of claim 2, wherein forming the source contact comprises forming the source contact at an equal distance from the first and second gate structures.

6. The method of claim 2, wherein forming the drain contact comprises forming the drain contact at an equal distance from the second and third gate structures.

7. The method of claim 1, wherein a distance between the first and third gate structures ranges from 100 nm to 300 nm.

8. The method of claim 1, wherein the spacing between the first and the second gate structures and the spacing between the second and the third gate structure range from 50 nm to 150 nm.

9. A method, comprising:
   forming a first gate structure, a second gate structure, a third gate structure, a fourth gate structure, and a fifth gate structure over a fin;
   forming a first source region between the first and second gate structures;
   forming a first drain region between the second and third gate structures, wherein the first drain region is larger than the first source region;
   forming a second source region between the third and fourth gate structures; and
   forming a second drain region between the fourth and fifth gate structures, wherein the second drain region is larger than the second source region.

10. The method of claim 9, wherein forming the first and second source regions comprises forming the first source region larger than the second source region.

11. The method of claim 9, wherein forming the first and second source regions comprises forming the first source region smaller than the second source region.

12. The method of claim 9, wherein forming the first and second drain regions comprises forming the first drain region smaller than the second drain region.

13. The method of claim 9, wherein forming the first and second drain regions comprises forming the first drain region larger than the second drain region.

14. The method of claim 9, further comprising:
disposing a first source contact on the first source region and a second source contact on the second source region; and
disposing a first drain contact on the first drain region and a second drain contact on the second drain region, wherein a distance between the first or second source contact and an adjacent gate structure is shorter than a distance between the first or second drain contact and the adjacent gate structure.

15. A method, comprising:
providing a substrate with a fin disposed thereon;
forming a first gate structure, a second gate structure, and a third gate structure on the fin, wherein the second gate structure is disposed between the first and third gate structures and is spaced apart from the first gate structure by a source region and from the third gate structure by a drain region larger than the source region;
forming a source contact on the source region; and
forming a drain contact on the drain region, wherein the second gate structure is closer to the source contact than to the drain contact.

16. The method of claim 15, wherein forming the source and drain contacts comprise forming the source and drain contacts with an equal width.

17. The method of claim 15, wherein a distance between the first and third gate structures ranges from 110 nm to 300 nm.

18. The method of claim 15, wherein forming the source contact comprises forming the source contact at an equal distance from the first and second gate structures.

19. The method of claim 15, wherein forming the drain contact comprises forming the drain contact at an equal distance from the second and third gate structures.

20. The method of claim 15, wherein a spacing between the first and second gate structures and a spacing between the second and third gate structure range from 50 nm to 150 nm.

* * * * *